(12) United States Patent
Oyamatsu

(10) Patent No.: US 6,593,654 B2
(45) Date of Patent: *Jul. 15, 2003

(54) SEMICONDUCTOR DEVICE AND METHOD FOR MANUFACTURING SAME

(75) Inventor: Hisato Oyamatsu, Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/272,299

(22) Filed: Mar. 19, 1999

(65) Prior Publication Data

US 2002/0070455 A1 Jun. 13, 2002

(30) Foreign Application Priority Data

Mar. 24, 1998 (JP) .......................................... 10-075573

(51) Int. Cl.$^7$ .............................................. H01L 23/48
(52) U.S. Cl. ....................... 257/758; 257/760
(58) Field of Search ................. 257/758, 760, 257/775; 438/620, 618, 624

(56) References Cited

U.S. PATENT DOCUMENTS

| | | | |
|---|---|---|---|
| 5,010,039 A | * 4/1991 | Ku et al. ..................... | 438/624 |
| 5,275,963 A | * 1/1994 | Cederbaum et al. ........ | 438/620 |
| 5,760,429 A | * 6/1998 | Yano et al. ................. | 257/711 |
| 5,856,706 A | * 1/1999 | Lee ............................. | 257/758 |
| 5,920,790 A | * 7/1999 | Wetzel et al. ............... | 438/618 |
| 6,022,804 A | * 2/2000 | Yano et al. .................. | 438/675 |
| 6,100,177 A | * 8/2000 | Noguchi ..................... | 438/620 |

FOREIGN PATENT DOCUMENTS

| | | |
|---|---|---|
| JP | 62-237747 | 10/1987 |
| JP | 1-138732 | 5/1989 |
| JP | 7-106324 | 4/1995 |
| JP | 9-321046 | 12/1997 |
| JP | 10-200075 | 7/1998 |

OTHER PUBLICATIONS

Copy of Notification of Reasons for Rejection (2) pages dated Aug. 13, 2002.
English Translation of Notification of Reasons for Rejection (2) pages dated Aug. 13, 2002.

* cited by examiner

Primary Examiner—T. N. Quach
(74) Attorney, Agent, or Firm—Banner & Witcoff, Ltd.

(57) ABSTRACT

An $SiO_2$ layer and an SiN layer are alternately stacked in regions 1 and 2 where the wiring film must be thin and thick, respectively, in such a manner that the stacked $SiO_2$ and SiN layers constitute first through sixth interlayer insulating films. The SiN layer may be replaced with a layer of another material having an etching selection ratio with reference to $SiO_2$. Then, resist having a cutout pattern is formed. The cutout pattern has a first via pattern in the first region and a first wiring pattern in the second region. With this resist used as a mask, the sixth, fifth, fourth and third insulating films are etched. Further, second resist having a cutout pattern is formed. The cutout pattern of the second resist has a second wiring pattern in the first region and a second via pattern in the second region. With the second resist used as a mask, the sixth and fifth insulating films are etched in the first region, and the second and first insulating films are etched in the second region. Simultaneous with this, the second and first insulating films are etched in the first region in accordance with the first via pattern. In this manner, the wiring film is thinner in the first region where the capacitance of micro wiring patterns should be suppressed than in the second region where a low resistance is required.

13 Claims, 6 Drawing Sheets

SEMICONDUCTOR DEVICE AND METHOD FOR MANUFACTURING SAME

BACKGROUND OF THE INVENTION

The present invention relates to a semiconductor device having a multilayer wiring structure, and more particular to a wiring method using dual Damascene technology.

In connection with the recent trend toward miniaturization of semiconductor elements, there is a demand for miniaturized wiring in the design of multilayer wiring structures for LSI. This is because the use of miniaturized wiring for the connection of the elements of LSI enables high-density element integration, provides a large number of functions for the LSI, and helps improve the performance. To meet the demand, a number of methods for forming trench wiring have been proposed.

A trench wiring forming method according to the prior art will be described with reference to FIGS. 7 through 11.

Referring first to FIG. 7, MOSFETs (101–110) are formed on a Si substrate 100 first of all. Subsequently, $SiO_2$ 111 serving as an interlayer insulating film is deposited by LP-CVD until the layer of $SiO_2$ has a thickness of 1,000 angstroms. On the resultant structure, BPSG (Boron Phosphorous Silicate Glass) 112 also serving as an interlayer insulating film is deposited by LP-CVD until the layer of BPSG has a thickness of 10,000 angstroms. The layer of BPSG 112 is then subjected to CMP (Chemical Mechanical Polishing) in such a manner that the insulating film portions located above the source/drain diffusion layers have a thickness of 5,000 angstroms. In this manner, the rough portions which the interlayer insulating films have in accordance with the shape of gate electrodes 105 are removed, thereby providing a flat surface. The resultant structure is overlaid with an insulating film which has an etching selection ratio with reference to the BPSG (i.e., which enables selective etching by utilization of the difference in etching rates). For example, SiN 113 is deposited by LP-CVD until the layer of SiN has a thickness of 5,000 angstroms.

As shown in FIG. 8, BPSG 114 serving as an interlayer insulating film is deposited over the SiN 113 by LP-CVD until the layer of the BPSG 114 has a thickness of 3,000 angstroms. Subsequently, SiN 115 is deposited over the resultant structure by LP-CVD until the layer of the SiN 115 has a thickness of 5,000 angstroms. Thereafter, contact holes through which wires are connected to the source, drain and gate electrodes of the MOSFETs are formed by photo-etching by use of a resist pattern 116, as shown in FIG. 9. The SiN 115 is removed by anisotropic plasma etching, with the resist pattern 116 used as a mask. Then, the BPSG 114 is removed by executing anisotropic plasma etching that provides an etching selection ratio with reference to SiN.

After the resist pattern 116 is removed by ashing treatment or the like, a resist pattern 120 is formed, as shown in FIG. 10. The resist pattern 120 has a wiring pattern formed by photo-etching. Subsequently, the SiN 115 (i.e., the uppermost one of the interlayer insulating films) and the SiN 113 located at the bottom of the contact pattern are removed by anisotropic plasma etching, and the BPSG 114, 112 and the $SiO_2$ 111 directly underneath the SiN 115, 113 are removed by executing anisotropic plasma etching that provides an etching selection ratio with reference to SiN. As a result, a trench whose depth is determined by the SiN 113 is formed as a wiring pattern, and a via hole serving as a contact section is defined within the wiring trench. The Via hole leads to the gate, source and drain electrodes.

The resist pattern 120, which was used as a mask when a wiring pattern is formed, is removed by ashing treatment or the like. Subsequently, Ti/TiN are deposited by sputtering until the layer of the Ti has a thickness of 200 angstroms and the layer of the TiN has a thickness of 700 angstroms. Al heated at 300° C. or higher is then deposited by sputtering. Since the Al maintains its fluid state when it is deposited, it flows into the via hole and the wiring pattern. Next, CMP is carried out to remove the metal portions other than the metal portions inside the wiring trench. The abrasives used in the CMP are selected from among materials that provide a selective abrasion ratio between the Al (a metal) and the SiN (i.e., materials that enables one of the Al and SiN to be selectively polished). By this CMP step, the trench wiring made of metal 117 is formed, as shown in FIG. 11. Thereafter, the process described above is repeated, and after the passivation step, an LSI is completed.

The method described above is considered to constitute the main technique of the future wiring technology. There are two reasons for this. First, in the conventional art which forms a fine wiring pattern by etching a metal layer, it is comparatively difficult to control an appropriate etching selection ratio between the wiring material and the resist, and the formation of a thin film of the resist material has come not to match the etching process. Second, in comparison with the case where wires laid out at close intervals are provided by etching a metal by using a resist pattern as a mask, the method described above enables treatment that is little affected by inclusion of dust particles or the like, and therefore enhances the manufacturing yields.

The recent progress in microstructure technology has provided more and more miniaturized elements. In addition, the wires that connect the elements are laid out at close intervals so as to arrange the elements at high density on an LSI. In other words, the adjacent wires are arranged as close as possible for high-density integration of elements. On the other hand, the distance between the wiring films, i.e., the thickness of the insulating films located between the wiring films, is not very short in comparison with the conductor spacing of wires. This is because the conductor spacing of wires is closely related with the density at which elements can be integrated on LSI chip, whereas the thickness of the insulating films between the wiring films is not. That is, the use of insulating films having a certain thickness is desirable because it helps reduce the capacitance between the wiring films and contributes a high-speed operation.

The recent progress in microstructure technology gives rise to an increase in the coupling capacitance between wires. It may be thought to use thin metal wiring films because they reduce the coupling capacitance and yet they are easy to work. At the same time, however, they result in an increase in wiring resistance and degrade the reliability in terms of the EM (electromigration). Accordingly, the characteristics of the resultant LSI are adversely affected.

As measures taken to provide a solution to the above problem, it is thought to provide a larger number of wiring films than before in such a manner that two types of wiring are formed in an LSI. To be more specific, the wiring films at a low level are made of thin films and arranged at short pitches, thereby providing local wiring. The wiring films at a high level are made of thick films and arranged at long pitches, thereby providing global wiring. That is, the higher level the wiring films are located at, the longer the wiring pitches and the thicker the wiring films are. The method that provides the above structure not only attains high-density integration but also solves the problems regarding the resistance and capacitance, and is therefore considered to improve the performance of the LSI. Due to the provision of a large number of wiring films, however, the method significantly increases the manufacturing cost and the number of defective densities, thus lowering the manufacturing yield.

BRIEF SUMMARY OF THE INVENTION

The present invention has been made to solve the above problems. An object of the invention is to improve the performance of an LSI by providing thin-film wiring films in regions where micro wiring lines (such as signal lines) are required and the coupling capacitance must be reduced, and providing thick-film wiring films in regions where power/GND potentials are applied as in a wiring section (the thick-film wiring films serve to reduce the wiring resistance and suppress a voltage drop which may occur if the wiring lines are long).

To provide this object, the present invention provides a semiconductor device which has Damascene wiring formed on a semiconductor, and which is featured in that the Damascene wiring located at the same level is made of a plurality of wiring films that are different in thickness.

In the semiconductor device of the present invention, even in the same wiring film, thicknesses of wiring portions where the wiring resistance must be as low as possible, as in a power supply line and a GND line, and wiring portions where the coupling capacitance should be suppressed, as in a micro wiring pattern portion are different from each other. To be more specific, the power supply line and the GND line are made of a thick-film portion and can therefore have a reduced resistance. Hence, the performance can be enhanced without producing factors that hinder high-density integration, such as wires of increased width.

The semiconductor device of the present invention is also featured in that the wiring of the memory cell section is thinner than the same-level wiring of the peripheral circuit section. In general, a semiconductor memory does not consume much power at a memory section since the elements provided in the memory section are miniaturized so as to attain high-density integration. In contrast, the semiconductor memory requires much power at the peripheral circuit section since the elements need not be arranged at very high density and since the elements in the peripheral circuit section have to be supplied with a large amount of current for a high-speed operation. Hence, an IR drop or a voltage drop can be prevented by providing a thick wiring film in the peripheral circuit section.

In the semiconductor memory, the bit lines have to be laid out as close as possible for high element density in the memory cell section. However, the bit lines are very close to one another, they may be subject to the adverse effects caused by the coupling between adjacent bit lines. The present invention suppresses the coupling capacitance by providing a thin wiring film. It should be noted that the word lines serve to conduct a potential and cannot be easily laid out at close pitches in the memory cell section. Due to the provision of a thin wiring film, the present invention attains a reduction in the coupling capacitance between adjacent wiring lines.

The present invention provides a method for manufacturing a semiconductor device having Damascene wiring formed on a semiconductor, the method comprising the steps of: first forming an element on a semiconductor substrate, then depositing a first insulating film and flattening the first insulating film; depositing a second insulating film on the first insulating film, the second insulating film having an etching selection ratio with reference to the first insulating film; depositing third and fourth insulating films on the second insulating film, the third and fourth insulating films being formed of materials similar in kind to those of the first and second insulating films, respectively; and depositing fifth and sixth insulating films on the fourth insulating film, the fifth and sixth insulating films being formed of materials similar in kind to those of the first and second insulating films, respectively.

Subsequently, a first contact pattern is formed in a first region where a thin-film wiring film is to be formed. First resist, having a cutout pattern corresponding to the first wiring pattern, is formed in a second region where a thick-film wiring film is to be formed. With the first resist used as a mask, the sixth, fifth, fourth and third insulating films are removed by anisotropic etching in the order named.

A second wiring pattern is formed in the first region. Second resist, having a cutout pattern corresponding to the second wiring pattern, is formed in the second region. With the second resist used as a mask, the sixth and fifth insulating films are removed from the first region by etching, and the second and first insulating films are removed from the second region by etching. In concurrence therewith, the second and first insulating films are removed from the first region by etching such that they are removed in accordance with the first contact pattern.

The wiring and contact trenches formed in the first and second regions and defined by the first through sixth insulating films are filled with a metallic material. As the last step, the metallic material is removed by CMP from the regions other than the trench, with the sixth insulating film used as a stopper.

According to this method, signal lines, a power supply line, a GND line, and other wiring lines, which in the prior art are defined by a number of layers so as to provide an optimal film thickness, can be defined by a single layer. Accordingly, the performance of the semiconductor device can be remarkably improved, and the number of steps required can be significantly reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

FIGS. 1 through 5 are sectional views illustrating the steps used for manufacturing the semiconductor device according to the first embodiment of the present invention.

Figure 1:
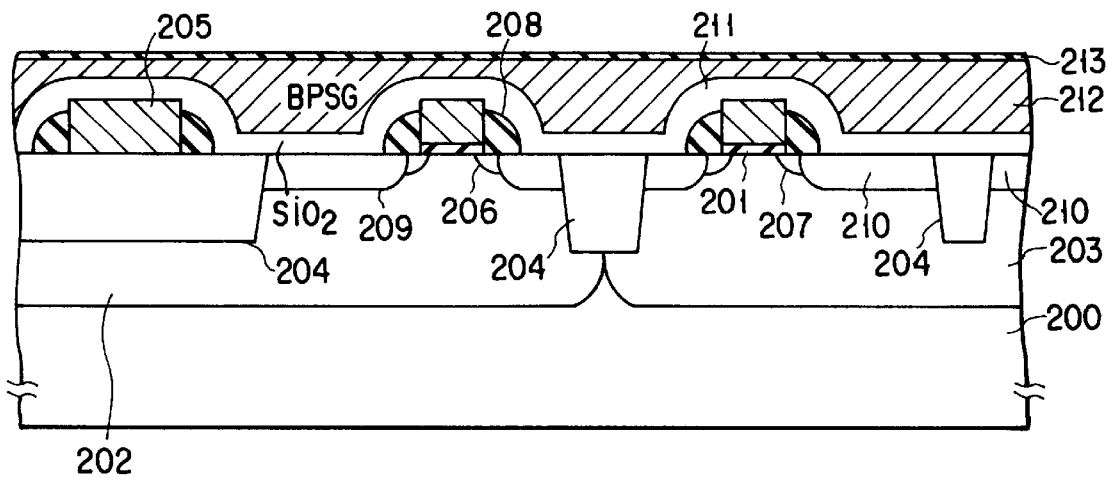
FIG. 1 is a sectional view illustrating the steps for manufacturing a semiconductor device according to the first embodiment of the present invention.

Referring first to FIG. 1, MOSFETs (201 to 210) are formed on a Si substrate 200. Specifically, element isolation regions 204 having an STI (shallow trench isolation) structure are formed in the Si Substrate 200, which is p type, for example. Then, impurities for defining a p-well 202 in which an n-MOSFET is formed and impurities for defining an n-well 203 in which a p-MOSFET is formed, are sequentially ion-implanted into the Si substrate 200 by photo-etching. Subsequently, the surface of the Si substrate 200 is thermally oxidized, thereby forming $SiO_2$ films that serve as gate insulating films 201. The gate insulating films 201 are overlaid with gate electrodes 205 of the n-MOSFET and p-MOSFET. The electrodes 205 are formed of polysilicon. Thereafter, impurities for defining n- region 206 on the side of n-MOSFET and impurities for defining p- region 207 on the side of p-MOSFET, are sequentially ion-implanted in a self-alignment manner with reference to the gate electrodes 205.

SiN is deposited over the surface of the Si substrate 200 by CVD, and SiN side walls 208 are formed on the side of the gate electrodes 205 by anisotropic etching. N-type impurities for forming a source/drain are ion-implanted on the side of the n-MOSFET. Likewise, p-type impurities for forming a source/drain are ion-implanted on the side of the p-MOSFET. The ion implantation is executed in a self-alignment manner with reference to the gate electrodes 205 having the SiN side walls 208. After forming N+/P+ source/drain regions in this manner, $SiO_2$ 211, which serves as an interlayer insulating film, is deposited on the MOSFET formed as above by LP-DVD. The deposition of the $SiO_2$ 211 is continued until the thickness becomes 1,000 angstroms. On the resultant structure, BPSG 212, which also serves as an interlayer insulating film, is deposited by LP-DVD. The deposition of the BPSG 212 is continued until the thickness becomes 10,000 angstroms. The resultant structure is polished by CMP in such a manner that the insulating film having a thickness of 5,000 angstroms is left on the source/drain diffusion layers. By this polishing, the rough portions which the interlayer insulating films have in accordance with the shape of gate electrodes 205 are removed, thereby providing a flat surface. The resultant structure is overlaid with an insulating film which has an etching selection ratio with reference to the BPSG. For example, SiN 213 is deposited by LP-CVD until the layer of the SiN 213 has a thickness of 500 angstroms.

Figure 2:
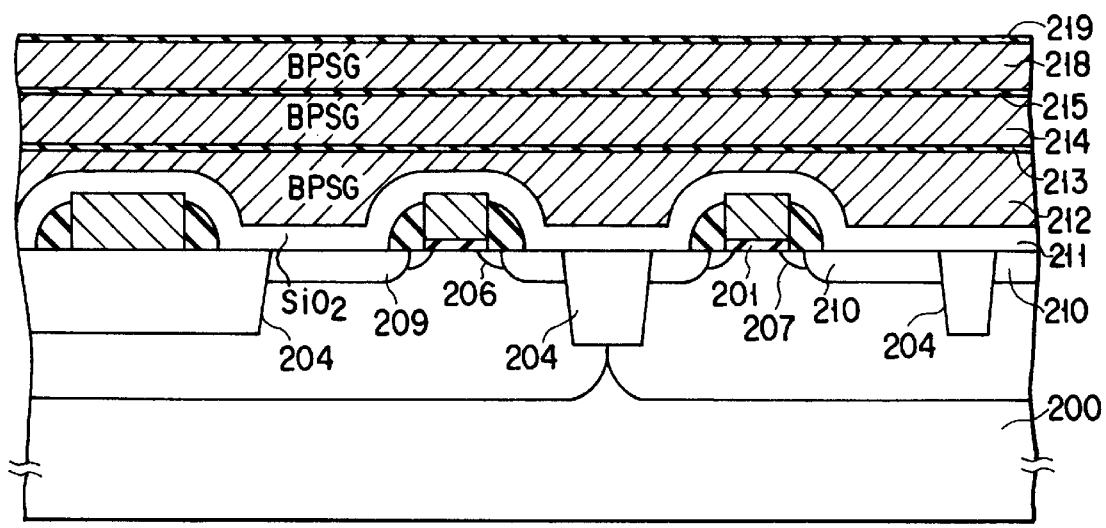
FIG. 2 is a sectional view illustrating steps used for manufacturing the semiconductor device according to the first embodiment of the present invention.

On the resultant structure, BPSG 214 and SiN 215, each of which serves as an interlayer insulating film, are sequentially deposited until the layer of the BPSG 214 becomes 3,000 angstroms thick and the layer of the SiN 215 becomes 500 angstroms thick, as shown in FIG. 2. Further, BPSG 218 and SiN 219, each of which serves as an interlayer insulating film, are sequentially deposited until the layer of the BPSG 218 becomes 3,000 angstroms thick and the layer of the SiN 219 becomes 500 angstroms thick, as shown in FIG. 2.

Figure 3:
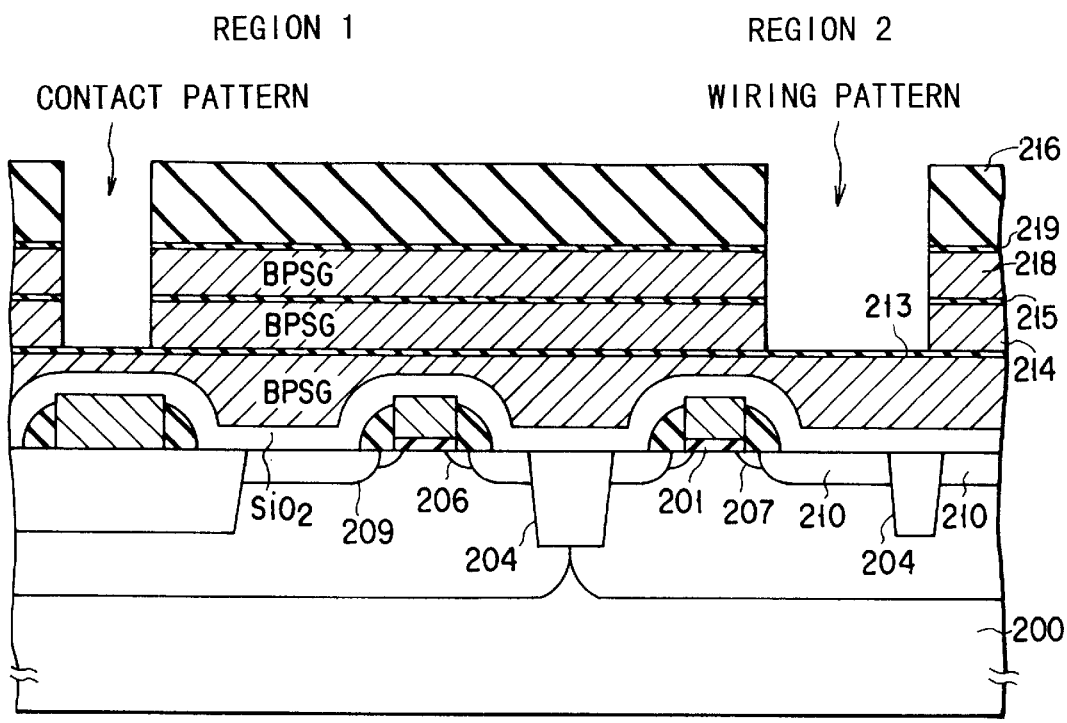
FIG. 3 is a sectional view illustrating the steps used for manufacturing the semiconductor device according to the first embodiment of the present invention.

As shown in FIG. 3, a resist pattern 216 having holes that correspond to a contact pattern and a wiring pattern in regions 1 and 2, respectively, is formed. Region 1 is a region where wiring films formed by photo-etching and connected to the drain/gate electrodes etc. of the MOSFETs must be thin for the suppression of the coupling capacitance, while region 2 is a region where the power supply line, the GND line or other elements that are little affected by the capacitance are to be provided. Then, the layer made up of the SiN 219, and BPSG 218 and SiN 215 is removed by anisotropic plasma etching, with the resist pattern 216 as a mask. Subsequently, the BPSG 214 is removed by anisotropic plasma etching that provides a etching selection ratio with reference to SiN.

Figure 4:
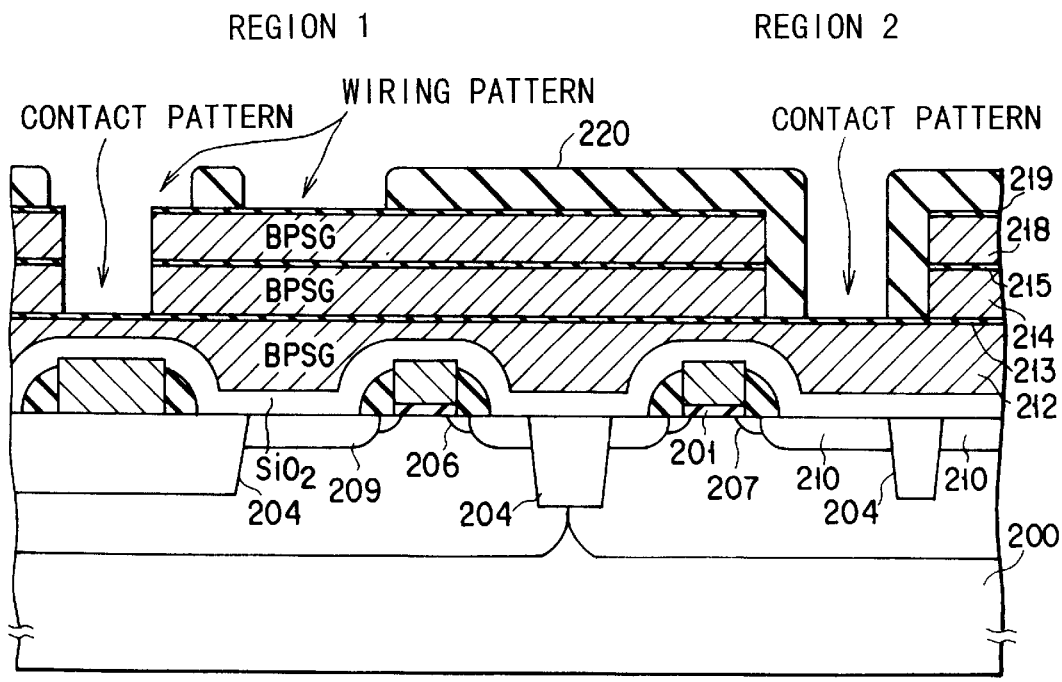
FIG. 4 is a sectional view illustrating the steps used for manufacturing the semiconductor device according to the first embodiment of the present invention.
Figure 5:
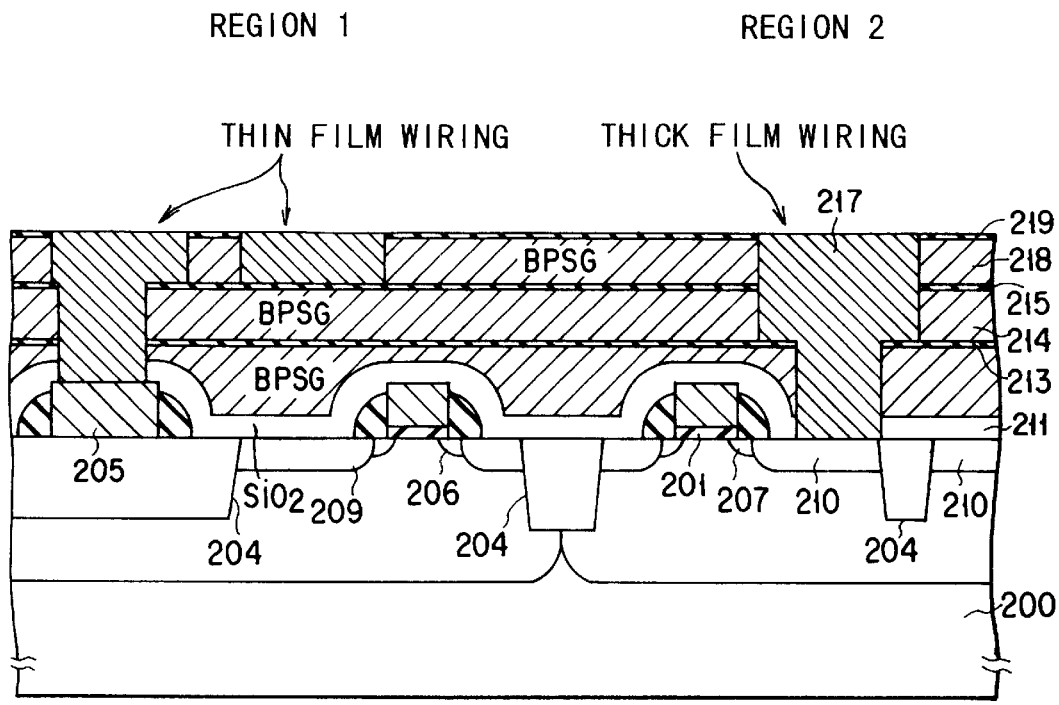
FIG. 5 is a sectional view illustrating the steps used for manufacturing the semiconductor device according to the first embodiment of the present invention.
Figure 7:
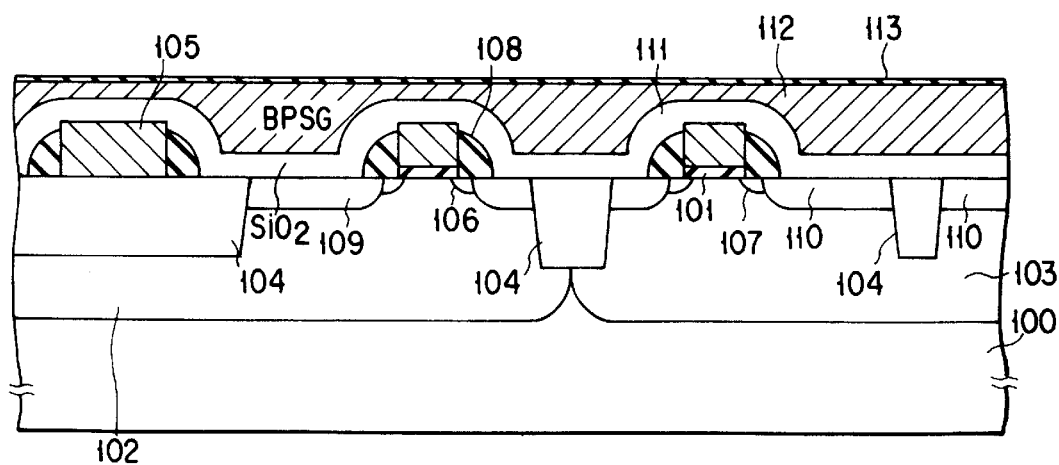
FIG. 7 is a sectional view illustrating a trench wiring-forming method according to the conventional art.

After the resist pattern 216 is removed by ashing or the like, resist 220 having holes that correspond to the contact pattern and the wiring pattern in regions 1 and 2, respectively, is formed by photo etching, as shown in FIG. 4. Then, the top layer portions of the exposed interlayer insulating films SiN 219 and 213 are removed, and the BPSG 218, the BPSG 212 and the $SiO_2$ 211 located just under the SiN 219 and SiN 213 are moved by anisotropic plasma etching that provides etching selection ratio with reference to SiN/Si. By this processing, the wiring pattern in region 1 has a depth determined by the film thickness between SiN 215 and SiN 219, while the wiring pattern in region 2 has a depth determined by the film thickness between SiN 213 and SiN 219. A via hole leading to the gate, source and drain electrodes and serving as a contact section in region 2 is defined inside the trench for the wiring pattern.

Then, the resist material 220, used as a mask when the wiring pattern is formed, is removed by ashing or the like, and Ti/TiN, for example, is deposited by sputtering until the layer of Ti becomes 200 angstroms thick and the layer of TiN becomes 700 angstroms thick. On the resultant structure, Al heated at a temperature of 300° C. or higher is deposited by sputtering until the layer of Al becomes 350 nm thick. Since the Al maintains its fluid state while the deposition is taking place, it flows into the via hole and the wiring pattern. As a result, the contact section and the wiring line are formed. Then, the metal is removed by CMP from the regions other than the region inside the wiring trench, by using a suitable metallic material (i.e., a material that provides an abrasion selection ratio between Al and SiN) as the abrasives of the CMP. After this polishing step, the trench wiring formed of the metal 217 is obtained. Thereafter, the process described so far is repeated as a wiring process. By executing a passivation step as the final step, the fabrication of the LSI is completed.

In the first embodiment described above, the wiring in region 1 may be used as signal lines of a memory cell section, such as bit lines, and the wiring in region 2 may be used as power supply lines or the like. If this is done, it is possible to fabricate a semiconductor memory which is highly integrated and operates at a high speed. Alternatively, the wiring in region 1 may be used as lines of the entire memory cell section of the semiconductor memory, while the wiring of region 2 may be used as lines of the peripheral circuit section.

Figure 6A:
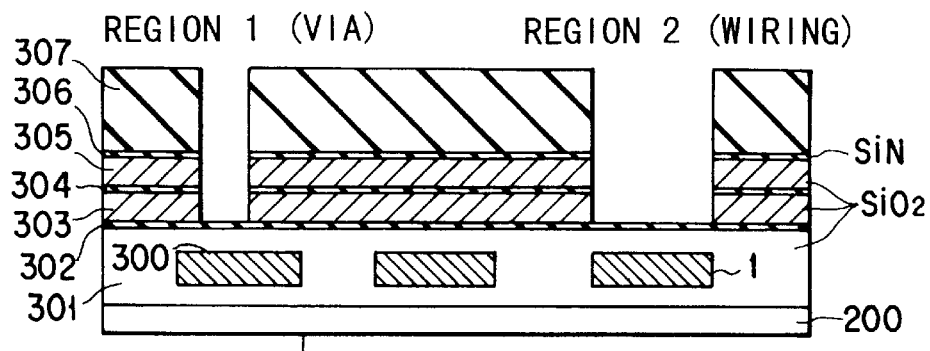
FIGS. 6A to 6C are sectional views illustrating the second embodiment of the present invention.
Figure 6B:
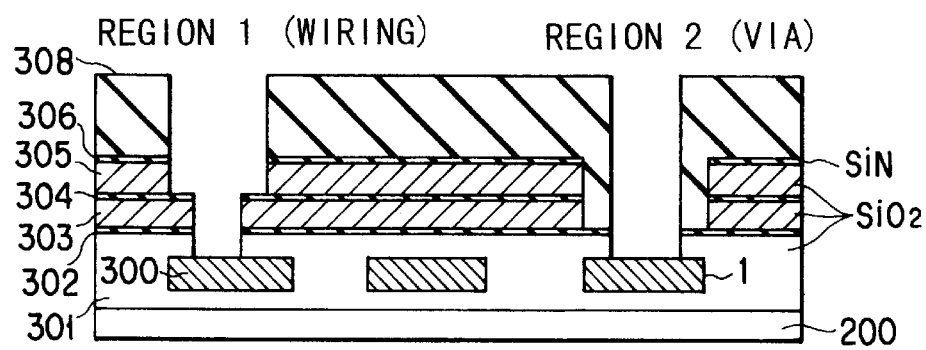
Figure 6C:
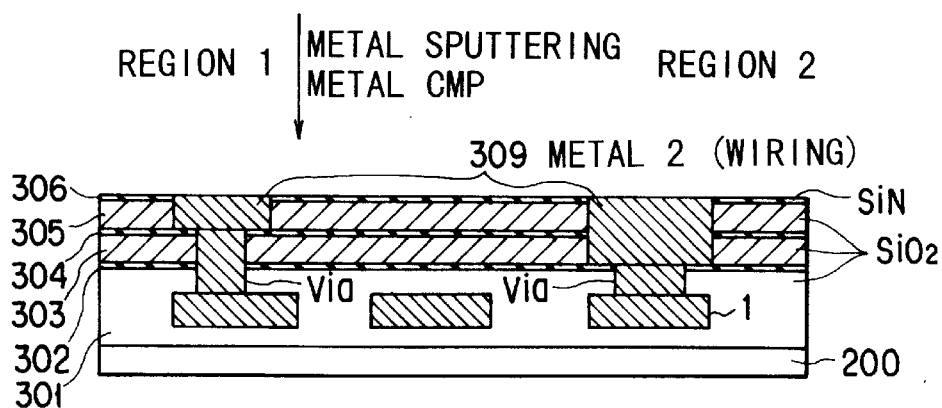
Figure 8:
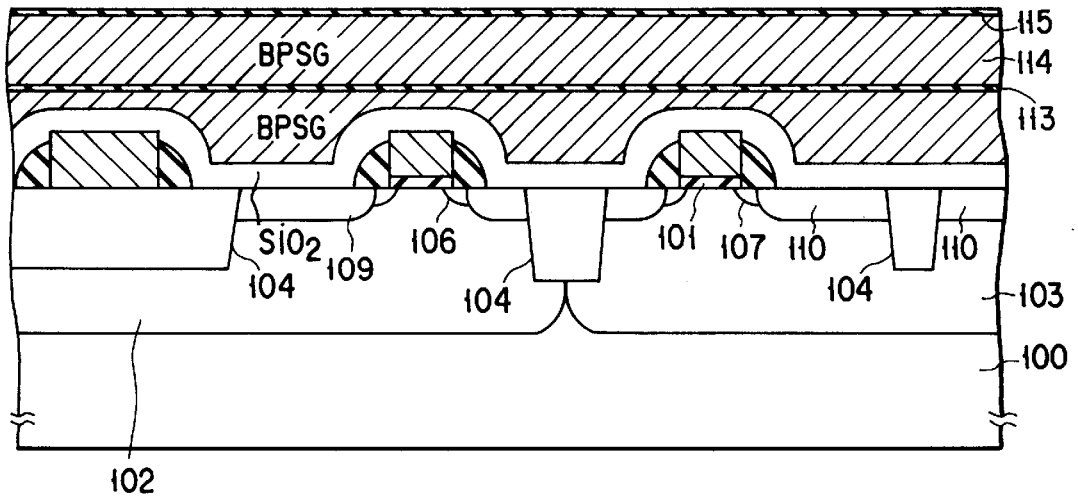
FIG. 8 is a sectional view illustrating the trench wiring-forming method according to the conventional art.
Figure 9:
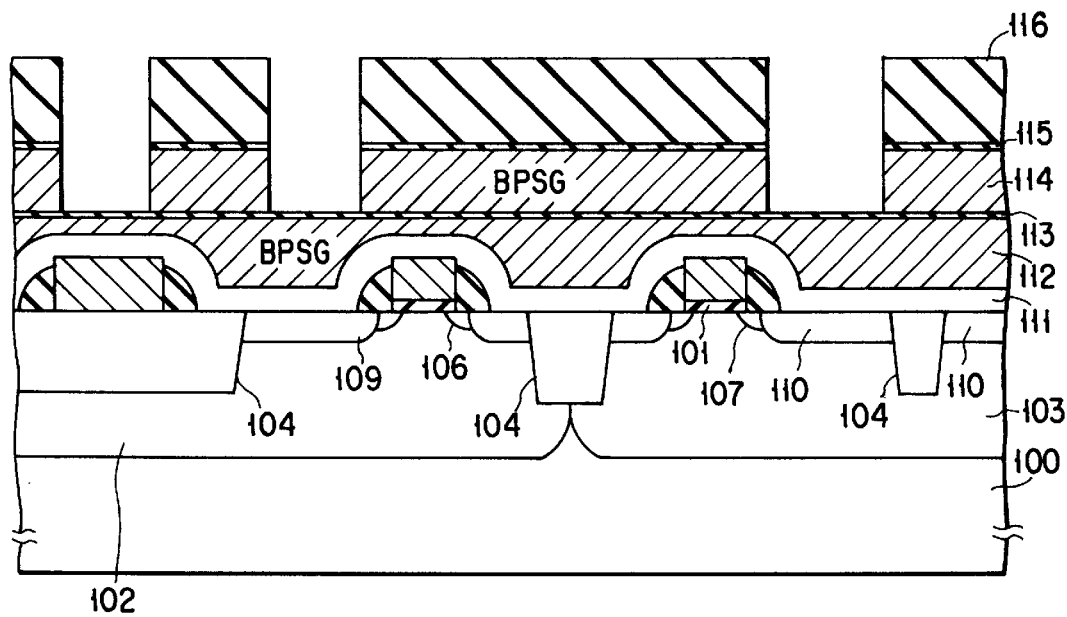
FIG. 9 is a sectional view illustrating the trench wiring-forming method according to the conventional art.
Figure 10:
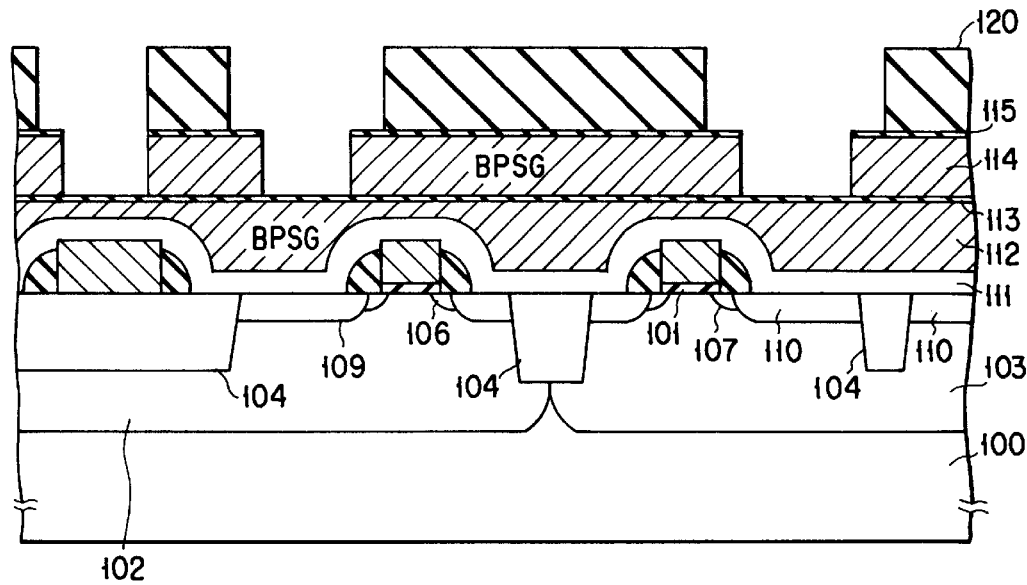
FIG. 10 is a sectional view illustrating the trench wiring-forming method according to the conventional art.
Figure 11:
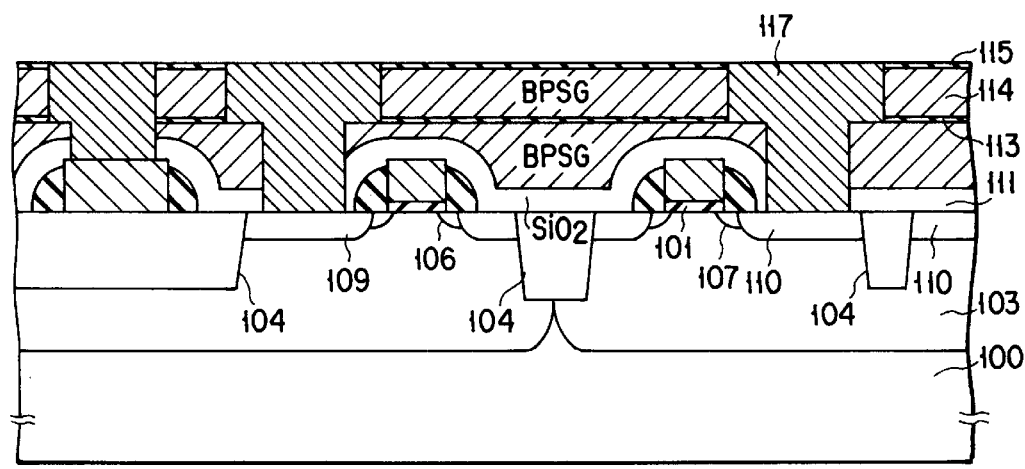
FIG. 11 is a sectional view illustrating the trench wiring-forming method according to the conventional art.

The second embodiment of the present invention will now be described with reference to FIGS. 6A to 6C. FIGS. 6A to 6C are sectional views illustrating the steps for forming a second-level metal wiring film of a multi-level wiring structure. According to the second embodiment, signal lines and power supply lines are formed in the region above $SiO_2$ 301 located on a metal pattern 300.

As shown in FIG. 6A, $SiO_2$ (303, 305) and SiN (302, 304; 306) are alternately stacked in regions 1 and 2 where the wiring film must be thin and thick, respectively. SiN may be replaced with another material having a selection ratio with reference to $SiO_2$. A resist pattern 307 having holes that correspond to a via pattern and a wiring pattern in regions 1 and 2, respectively, is formed. The interlayer insulating films are etched in the same manner as that of the first embodiment.

Next, as shown in FIG. 6B, a resist pattern 308 having holes that correspond to a wiring pattern for signal lines and a via pattern in regions 1 and 2, respectively, is formed. The interlayer insulating films are further etched in the same manner as that of the first embodiment. By this etching, a via hole leading to metal 300 is formed.

As in the first embodiment, Ti/TiN Is deposited by sputtering, and then Al is deposited by sputtering so that Al can flow into the via hole and the wiring pattern. By executing CMP, the metal is removed from the regions other than the region inside the wiring trench. As a result, the trench wiring constituted by the second-level metal 309 is formed, as shown in FIG. 6C.

In the above manner, the wiring film in region 1 (where the suppression of the capacitance between the wiring lines is important) is controlled to be thinner than the wiring film in region 2 (where a reduction in the resistance is important). As a result, the performance of the resultant LSI improved.

In the embodiments described above, reference was made to the case where metal wiring is provided for a single-level structure or the case where metal wiring is provided for the second level of a multi-level structure. As can be easily understood from the foregoing descriptions, the present invention is not applicable only to such metal wiring films referred to in the above. In other words, the process of the present invention is applicable to the wiring films of every type, and even the metal wiring film of the same level is made to have different-thickness portions.

As detailed above, even the same wiring film has a thickness difference between a wiring portion where the wiring resistance must be as low as possible and a wiring portion where the coupling capacitance of micro wiring patterns should be suppressed. In the latter wiring portion, the wiring film is thin for suppressing the coupling capacitance. In the former wiring portion, the wiring film is thick for reducing the resistance. Hence, the performance of the semiconductor 7 device can be enhanced without producing factors that hinder high-density integration, such as wires of increased width.

The metallic material of which to form a wiring film is not limited to Al. Other metal materials, such as Cu, Ag and Au, may be used instead as long as these materials are low in resistance. In addition, the interlayer insulating films need not be $SiO_2$ and BPSG. Oxides of other types or materials exhibiting similar characteristics may be employed in place of $SiO_2$ and BPSG. Further, SiN may be replaced with another material as long as it has an etching selection ratio with reference to an oxide-based material. As can be seen from these, the present invention can be modified in various manners without departing from the spirit and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device having Damascene wiring formed above a semiconductor including a semiconductor substrate, said Damascene wiring comprising:
    a first wiring portion including a first wiring and a first via portion, said first wiring extending in a direction parallel to a surface of the semiconductor substrate, and having a substantially equal thickness throughout a length thereof;
    a second wiring portion including a second wiring whose film thickness is greater than that of the first wiring, and a second via portion, said second wiring extending in the direction parallel to the surface of the semiconductor substrate, and having a substantially equal thickness throughout a length thereof,
    wherein insulating films that are in contact with the first via portion are greater in number than insulating films that are in contact with the second via portion.

2. A semiconductor device according to claim 1, wherein a wiring used as signals is thinner than at least one of wires used as power supply lines and wires used as grounding lines.

3. A semiconductor device according to claim 1, comprising a memory cell section and a peripheral circuit section, a wiring of the memory cell section being thinner than a same-level wiring of the peripheral circuit section.

4. A semiconductor device according to claim 3, wherein at least one of a wiring used as bit lines of the memory cell section and a wiring used as word lines of the memory cell section is thinner than the same-level wiring of the peripheral circuit section.

5. A semiconductor device according to claim 1, wherein said Damascene wiring is made of a single-layer film, and the single-layer film has a plurality of different-thickness portions.

6. A semiconductor device according to claim 5, wherein a wiring film used as signal lines are thinner than at least one of a wiring film used as a power supply line and a wiring film used as grounding lines.

7. A semiconductor device according to claim 6, comprising a memory cell section and a peripheral circuit section, a wiring film of the memory cell section being thinner than a same-level wiring film of the peripheral circuit section.

8. A semiconductor device according to claim 7, wherein at least one of a wiring film used as bit lines of the memory cell section and a wiring film used as word lines of the memory cell section is thinner than the same-level wiring film of the peripheral circuit section.

9. A semiconductor device according to claim 1, wherein said first wiring is in contact with at least three layers of insulating films, and wherein said second wiring is in contact with at least five layers of insulating films.

10. A semiconductor device according to claim 1 wherein insulating films that are in contact with the first wiring and the first via portion are equal in number to insulating films that are in contact with the second wiring and the second via portion.

11. A semiconductor device having Damascene wiring formed above a semiconductor including a semiconductor substrate, said Damascene wiring comprising:

a first wiring portion including a first wiring and a first via portion, said first wiring extending in a direction parallel to a surface of the semiconductor substrate, and having a substantially equal thickness throughout a length thereof;

a second wiring portion including a second wiring whose film thickness is greater than that of the first wiring, and a second via portion, said second wiring extending in the direction parallel to the surface of the semiconductor substrate, and having a substantially equal thickness throughout a length thereof, wherein insulating films that are in contact with the first via portion are greater in number than insulating films that are in contact with the second via portion, and insulating films that are in contact with the first wiring and the first via portion are equal in number to insulating films that are in contact with the second wiring and the second via portion.

12. A semiconductor device having Damascene wiring formed above a semiconductor including a semiconductor substrate, said Damascene wiring comprising:

a first wiring portion including a first wiring and a first via portion, said first wiring extending in a direction parallel to a surface of the semiconductor substrate, and said first via portion extends in a direction perpendicular to the surface of the semiconductor substrate;

a second wiring portion including a second wiring whose film thickness is greater than that of the first wiring, and a second via portion, said second wiring extending in the direction parallel to the surface of the semiconductor substrate, and said second via portion extends in the direction perpendicular to the surface of the semiconductor substrate, wherein insulating films that are in contact with the first via portion are greater in number than insulating films that are in contact with the second via portion.

13. A semiconductor device according to claim 12 wherein insulating films that are in contact with the first wiring and the first via portion are equal in number to insulating films that are in contact with the second wiring and the second via portion.

* * * * *